(12) United States Patent
Hu

(10) Patent No.: US 10,535,582 B2
(45) Date of Patent: Jan. 14, 2020

(54) SEMICONDUCTOR THERMAL-CONDUCTIVE HEAT SINK STRUCTURE

(71) Applicant: Wen-Sung Hu, Tainan (TW)

(72) Inventor: Wen-Sung Hu, Tainan (TW)

( * ) Notice: Subject to any disclaimer, the term of this patent is extended or adjusted under 35 U.S.C. 154(b) by 71 days.

(21) Appl. No.: 15/820,938

(22) Filed: Nov. 22, 2017

(65) Prior Publication Data

US 2019/0115276 A1    Apr. 18, 2019

(30) Foreign Application Priority Data

Oct. 13, 2017    (TW) .............................. 106135166 A

(51) Int. Cl.
| | |
|---|---|
| *H01L 23/367* | (2006.01) |
| *H01L 23/373* | (2006.01) |
| *H01L 23/34* | (2006.01) |
| *F21V 19/00* | (2006.01) |
| *F21V 23/00* | (2015.01) |
| *H05K 1/02* | (2006.01) |
| *F28F 3/04* | (2006.01) |
| *H01L 23/40* | (2006.01) |

(52) U.S. Cl.
CPC ........ *H01L 23/3675* (2013.01); *F21V 19/003* (2013.01); *F21V 19/005* (2013.01); *F21V 23/004* (2013.01); *F28F 3/046* (2013.01); *H01L 23/34* (2013.01); *H01L 23/367* (2013.01); *H01L 23/3672* (2013.01); *H01L 23/373* (2013.01); *H01L 23/3736* (2013.01); *H01L 23/4006* (2013.01); *H05K 1/021* (2013.01); *H05K 1/0206* (2013.01); *H05K 1/0209* (2013.01)

(58) Field of Classification Search
CPC combination set(s) only.
See application file for complete search history.

(56) References Cited

U.S. PATENT DOCUMENTS

2015/0338082 A1\* 11/2015 Hu .......................... F21K 9/23
                                                            362/373

\* cited by examiner

*Primary Examiner* — Thanhha S Pham
(74) *Attorney, Agent, or Firm* — Alan D. Kamrath; Karin L. Williams; Mayer & Williams

(57) ABSTRACT

A semiconductor thermal-conductive heat sink structure includes a substrate and a thermal-conductive heat sink device. The substrate includes opposed upper and lower planes. A top conductive copper foil is provided on the upper plane to carry a semiconductor device. The thermal-conductive heat sink device includes at least one cooling fin and a high thermal-conductive rivet. A clearance is formed between the cooling fin and a thermal-conductive heat sink device socket or between two adjacent cooling fins such that greater cooling areas are available to the thermal-conductive heat sink device. With the thermal-conductive rivet joining the top conductive copper foil and the cooling fins, heat generated by the activated semiconductor device is quickly conducted through the rivet and dissipated from the greater cooling areas of the cooling fins to prevent malfunction of the semiconductor device attributed to heat accumulation induced by poor heat dissipation.

16 Claims, 17 Drawing Sheets

SEMICONDUCTOR THERMAL-CONDUCTIVE HEAT SINK STRUCTURE

BACKGROUND OF THE INVENTION

1. Field of the Invention

The present invention relates to a semiconductor thermal-conductive heat sink structure and, more particularly, to a thermal-conductive heat sink device which depends on greater cooling areas to enhance cooling effect of a semiconductor device.

2. Description of the Related Art

As the symbol of prosperity of science and technologies, electronic products available for living, transportation and recreation are becoming more compact and sophisticated. However, the characteristic of basic devices (i.e., semiconductor devices) generating heat is a concern regarding the functions of the devices. For example, a mobile phone or a tablet product is thinner and includes built-in applications (apps), and network speed is the first priority of Internet users. Consequentially, some problems are attendant, for example, regarding how to dissipate heat generated by activated semiconductor devices, such as chips, effectively and maintain the reliability of the semiconductor devices. In this regard, some examples of cooling components for a traditional mobile phone include copper cables, copper bars and copper pipes for heat conduction for a middle/low-end mobile phone, or, a chilling copper pipe, condensing copper pipe and condensing chamber for a high-end mobile phone. Moreover, to promote the heat conduction capacity and cooling effect of a mobile phone's metal shell frame surface exposed to ambient air, a heat-conductive device connected to a mobile phone's aluminum-alloy shell is also available for some high-end mobile phones. However, convection cooling between ambient air and a mobile phone or a tablet device, which is sealed internally, is available through a headphone jack or a connector port only, rather than having redundant vent ports, so that neither foreign objects nor moisture permeate inside. Accordingly, a mobile phone or a tablet device in which heat has accumulated is frequently subject to serious malfunctions and may be overwhelmed by burnt semiconductor chips, a hot body or an overheated phone battery.

The above problems still exist despite several solutions for heat sinks proposed by manufacturers such as a graphite dissipater, temperature equalizer, cooling fin or thermal pipe inside a mobile phone or a tablet device for a better cooling effect for semiconductors.

BRIEF SUMMARY OF THE INVENTION

Therefore, it is an objective of the present invention to overcome the aforementioned shortcomings and deficiencies of the prior art by providing a semiconductor thermal-conductive heat sink structure which is adapted to be installed inside an existing thermal-conductive body in each of various types of electronic products, such as mobile phones and tablet devices, providing greater cooling areas for better heat conduction and cooling effects, less heat accumulation, and normal operation of the semiconductor devices.

The semiconductor thermal-conductive heat sink structure of the present invention includes a thermal-conductive heat sink device adapted to be connected to a substrate. The substrate includes an upper plane and a lower plane opposed to the upper plane, and the upper plane is provided with a top conductive copper foil on which a semiconductor device is mounted. The thermal-conductive heat sink device includes a first cooling fin and a thermal-conductive rivet. The first cooling fin includes first and second surfaces opposed in a thickness direction, both of which constitute cooling planes exposed to ambient air. The thermal-conductive rivet thermally joins the first cooling fin and the top conductive copper foil for development of cooling planes at the first and second surfaces of the first cooling fin such that heat generated by the semiconductor device is conducted and dissipated through the first and second surfaces of the first cooling fin.

In another embodiment, the semiconductor thermal-conductive heat sink of the present invention includes the thermal-conductive heat sink device and the substrate.

In one embodiment, the thermal-conductive heat sink device is mounted on a socket for the thermal-conductive heat sink device. A plurality of convex portions are provided between the first cooling fin and the socket. The first cooling fin and the socket are separated from each other by a clearance defined by the convex portions. The convex portions protrude toward the first cooling fin from the socket or toward the socket from the first cooling fin.

In a preferred form, the thermal-conductive heat sink device further includes at least one second cooling fin separated from the first cooling fin in the thickness direction. The first cooling fin includes spaced first and second ends. The first end of the first cooling fin is thermally connected to the top conductive copper foil by the thermal-conductive rivet. The second cooling fin includes first and second ends which join the first and second ends of the first cooling fin by two rivets, respectively.

In a preferred form, each of the first and second cooling fins is provided with a plurality of convex portions. The convex portions of the first and second cooling fins protrude toward the same direction and are staggered in arrangement, and the convex portions of the first cooling fin abut the second cooling fin.

The semiconductor thermal-conductive heat sink structure of the present invention is characteristic of a clearance between two adjacent cooling fins or between a cooling fin and a thermal-conductive heat sink device socket for greater cooling areas of cooling fins such that heat generated by an activated semiconductor device is quickly conducted and dissipated from the greater cooling areas so there is no malfunction of the semiconductor device attributed to heat accumulation induced by poor heat dissipation.

The present invention will become clearer in light of the following detailed description of illustrative embodiments of this invention described in connection with the drawings.

DESCRIPTION OF THE DRAWINGS

The illustrative embodiments may best be described by reference to the accompanying drawings where.

DETAILED DESCRIPTION OF THE INVENTION

Figure 1:
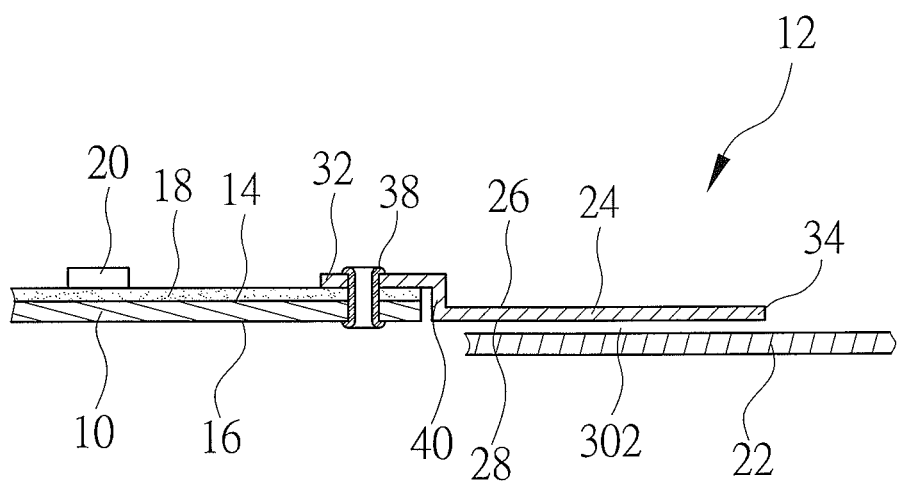
FIG. 1 is a schematic view of a semiconductor thermal-conductive heat sink structure according to a first embodiment of the present invention.

A semiconductor thermal-conductive heat sink structure of a first embodiment of the present invention is shown in FIG. 1 of the drawings and generally includes a thermal-conductive heat sink device 12 which is adapted to be connected to a substrate 10. In a feasible embodiment, the semiconductor thermal-conductive heat sink structure includes the substrate 10 and the thermal-conductive heat sink device 12. The substrate 10 can be a printed circuit board (PCB) or an aluminum substrate. The substrate 10 includes an upper plane 14 and a lower plane 16 opposed to the upper plane 14. The upper plane 14 is provided with a top conductive copper foil 18 on which a semiconductor device 20 (for example, a chip) is mounted.

The thermal-conductive heat sink device 12, which is thermally combined with the top conductive copper foil 18 for heat conduction, includes a first cooling fin 24 and a high thermal-conductive rivet 38 made of metal material (for example copper material). The first cooling fin 24 includes first and second surfaces 26 and 28 opposed in a thickness direction for development of cooling planes at the first and second surfaces 26 and 28. The thermal-conductive heat sink device 12 is mounted on a thermal-conductive heat sink device socket 22. The second surface 28 and the socket 22 are separated from each other to create a clearance 302 as a cooling space in between. The thermal-conductive rivet 38, which is made of high-conductive metal material, combines the first cooling fin 24, the top conductive copper foil 18 and the upper and lower planes 14 and 16 of the substrate 10, joining the first cooling fin 24 and the substrate 10. As such, with the semiconductor device 20 activated, heat generated at the top conductive copper foil 18 is quickly conducted to the first cooling fin 24 through the thermal-conductive rivet 38 for a better cooling effect. Comparatively, heat generated at a conventional semiconductor device is not smoothly conducted from a copper foil on a substrate on which a common cooling body is mounted through conventional tin solder with low heat conductivity for Surface Mounted Technology (SMT).

Figure 2:
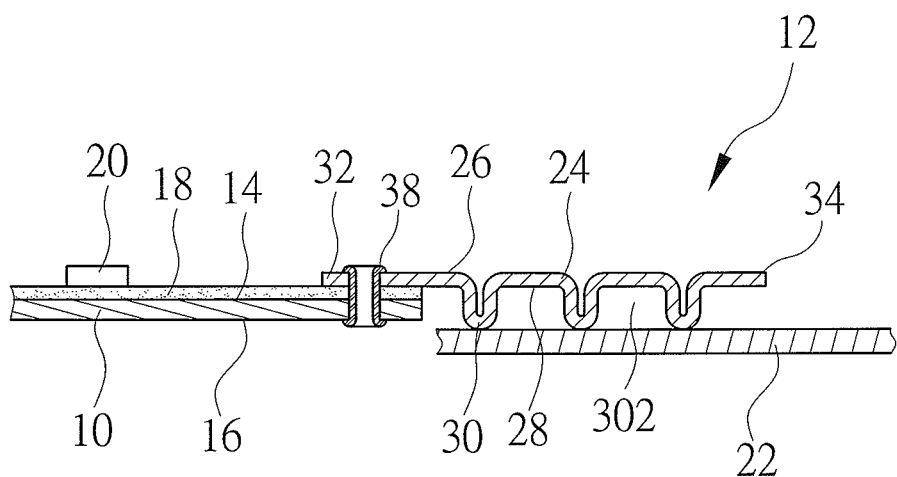
FIGS. 2, 2a, and 2b are schematic views for three patterns of a semiconductor thermal-conductive heat sink structure according to a second embodiment of the present invention.
Figure 2A:
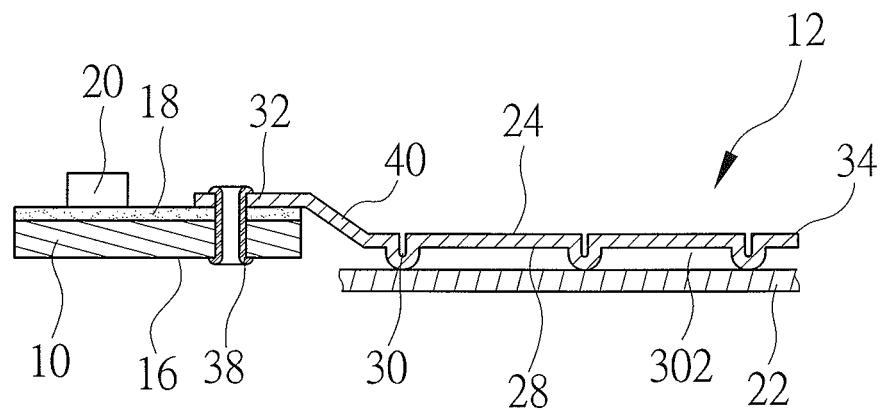
Figure 2B:
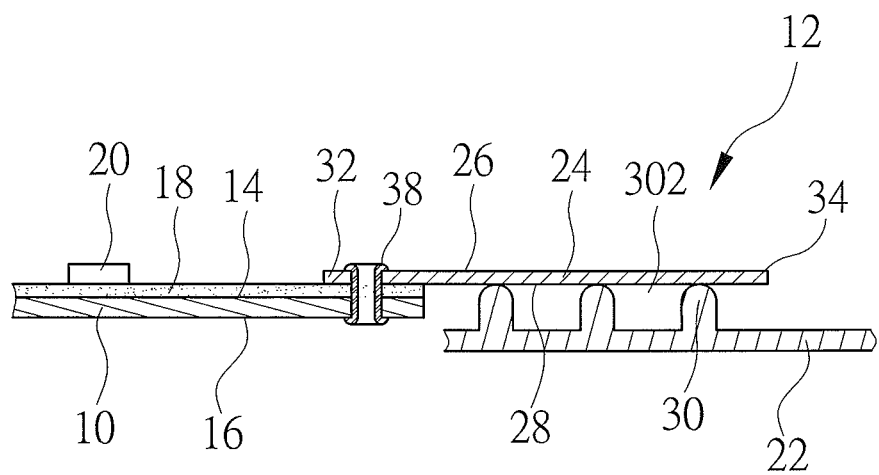

FIGS. 2, 2a and 2b illustrate a semiconductor thermal-conductive heat sink structure in a second embodiment of the present invention. In this embodiment, a plurality of convex portions 30 is provided between the first cooling fin 24 and the socket 22. The convex portions 30, which can be convex pillars, protrude outward from the second surface 28 of the first cooling fin 24 (see FIGS. 2 and 2a) such that the first cooling fin 24 and the socket 22 develop a clearance 302 in between due to the existence of the convex portions 30. The first cooling fin 24 includes first and second ends 32 and 34 spaced from each other. As shown in FIG. 2a, an inclined bending portion 40 between the first and second ends 32 and 34 of the first cooling fin 24 lowers the height of the convex portions 30 such that the clearance 302 between the first cooling fin 24 and the socket 22 is reduced. In a feasible embodiment, the bending portion 40 is extended at right angle. The convex portions 30 may protrude from a top surface of the socket 22 and toward the first cooling fin 24 (FIG. 2b). The convex portions 30 may be ridges, bumps or raised terraces structurally. The first cooling fin 24 abuts the socket 22 by the convex portions 30 such that the clearance 302 is stably maintained. Moreover, the first end 32 contacts and joins the top conductive copper foil 18 by the thermal-conductive rivet 38 such that heat generated by the semiconductor device 20 can be dissipated from exposed surfaces (the first and second surfaces 26 and 28) of the first cooling fin 24.

Figure 3:
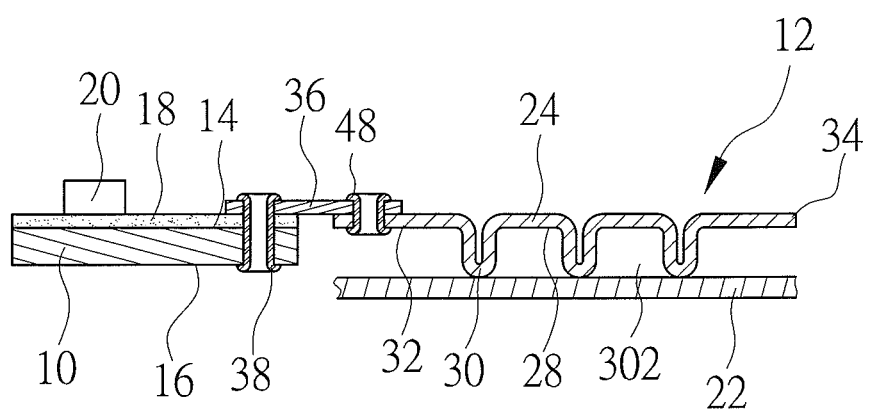
FIG. 3 is a schematic view of a semiconductor thermal-conductive heat sink structure according to a third embodiment of the present invention.

FIG. 3 illustrates a semiconductor thermal-conductive heat sink structure in a third embodiment of the present invention. In this embodiment, the thermal-conductive heat sink device 12 further includes a thermal bridge 36. The first end 32 of the first cooling fin 24 is combined with the top conductive copper foil 18 through the thermal bridge 36 for heat conduction. The thermal bridge 36, which joins the top conductive copper foil 18 by the thermal-conductive rivet 38, is connected to the first end 32 of the first cooling fin 24 by a rivet 48. The thermal bridge 36 is made from material with better heat conductivity and capable of quickly conducting heat generated by the semiconductor device 20 to the first cooling fin 24 for a better cooling effect.

Figure 4:
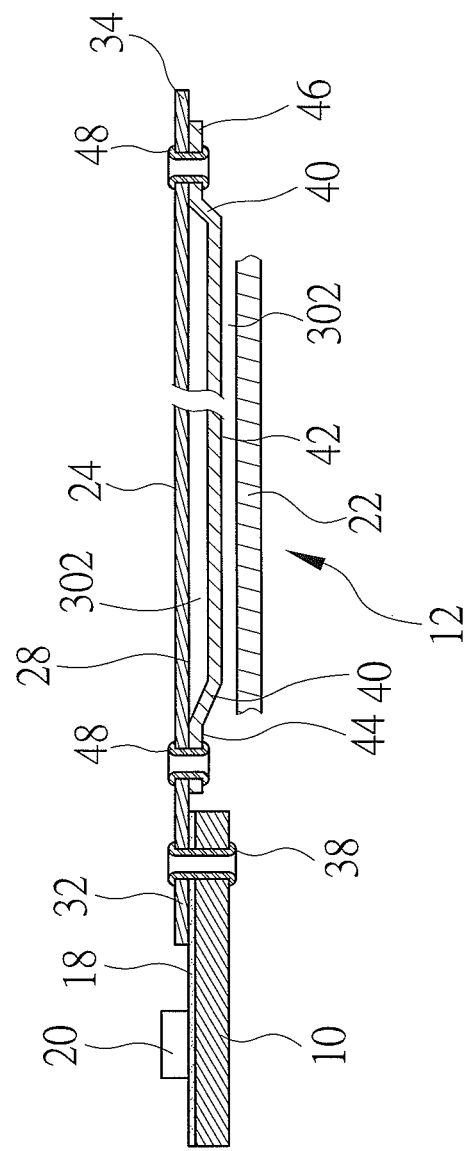
FIGS. 4, 4a, 4b, and 4c are schematic views for four patterns of a semiconductor thermal-conductive heat sink structure according to a fourth embodiment of the present invention.
Figure 4A:
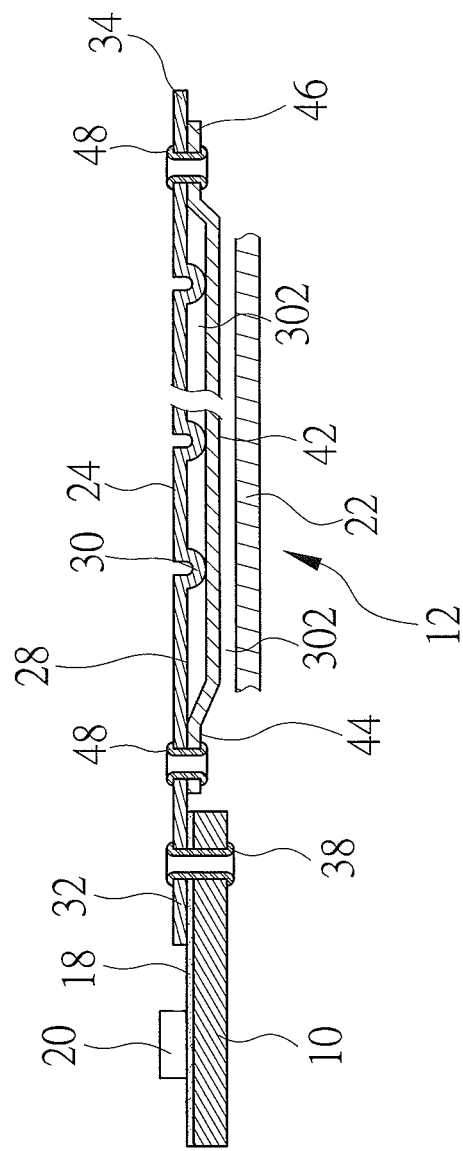
Figure 4B:
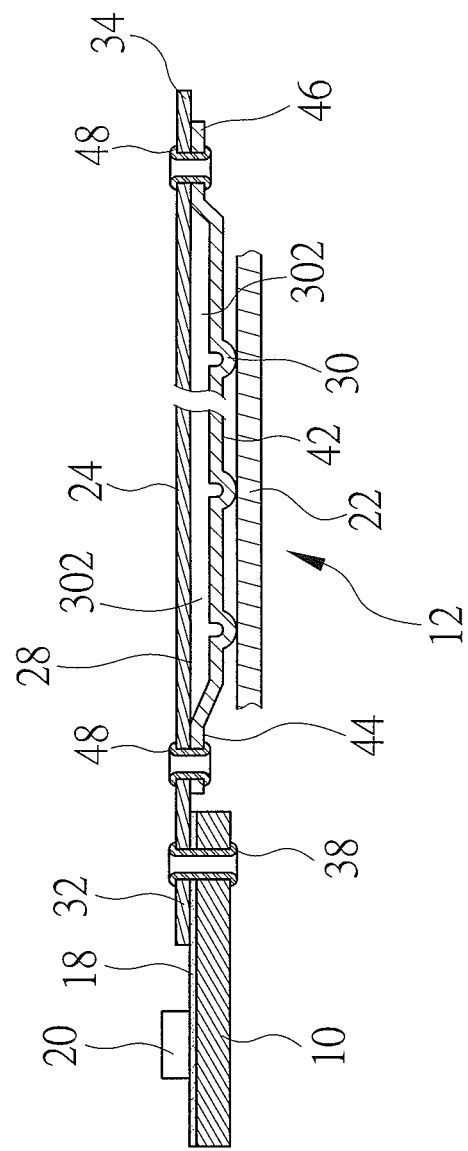
Figure 4C:
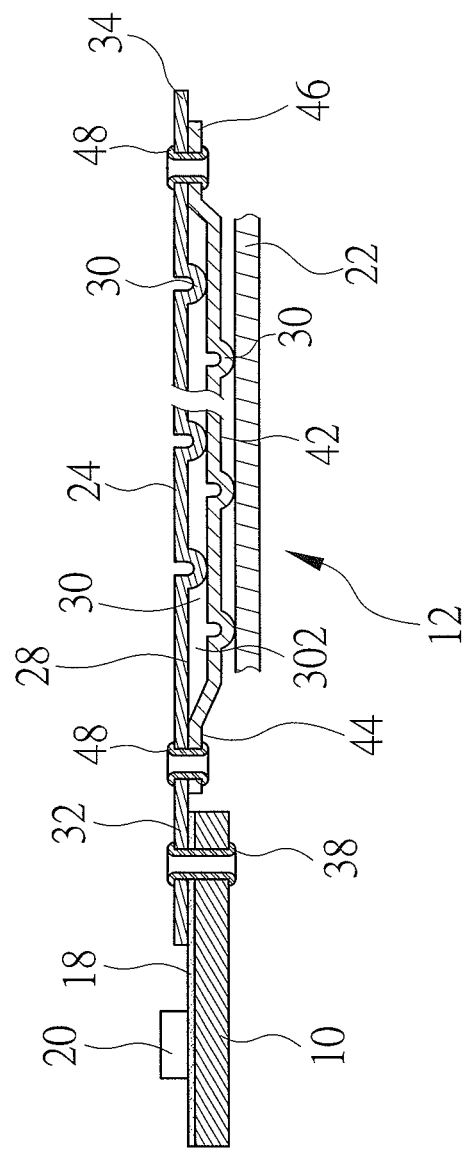

FIGS. 4, 4a, 4b and 4c illustrate a semiconductor thermal-conductive heat sink structure in a fourth embodiment of the present invention. In this embodiment, the thermal-conductive heat sink device 12 further includes a second cooling fin 42. Each of the first and second cooling fins 24 and 42 can be a planar laminate without any convex portion 30 (FIG. 4). The second cooling fin 42 includes spaced first and second ends 44 and 46, and two inclined bending portions 40 is formed between the first and second ends 44 and 46. The first and second ends 44 and 46 of the second cooling fin 42 respectively join the first and second ends 32 and 34 of the first cooling fin 24 by two rivets 48 such that a clearance 302 is formed between the first and second cooling fins 24, 42 and between the second cooling fin 42 and the socket 22. As shown in FIG. 4a, the convex portions 30 of the first cooling fin 24 are distributed between the first and second cooling fins 24 and 42, so that the first cooling fin 24 and the second cooling fin 42 are separated from each other in the thickness direction by the clearance 302 due to existence of the convex portions 30. As shown in FIG. 4b, the first and second cooling fins 24 and 42 develop a clearance 302 in between and the second cooling fin 42 includes a plurality of convex portions 30 protruding outward from a bottom surface of the second cooling fin 42. As shown in FIG. 4c, both the convex portions 30 of the first cooling fin 24 and the convex portions 30 of the second cooling fin 42 protrude toward the same direction and are staggered in arrangement, and the convex portions 30 of the first cooling fin 24 abut the second cooling fin 42.

Figure 5:
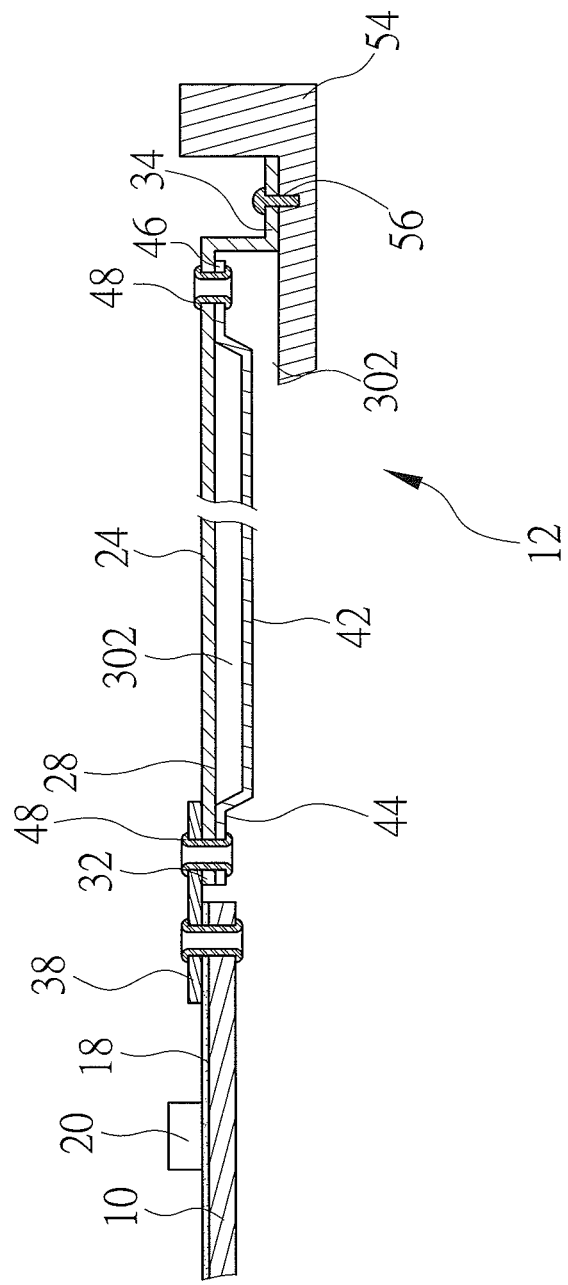
FIG. 5 is a schematic view of a semiconductor thermal-conductive heat sink structure according to a fifth embodiment of the present invention.

FIG. 5 illustrates a semiconductor thermal-conductive heat sink structure in a fifth embodiment of the present invention. In contrast to the semiconductor thermal-conductive heat sink structure in FIG. 4, the semiconductor thermal-conductive heat sink structure in the fifth embodiment allows the second end 34 of the first cooling fin 24 to join a metal base 54 (for example, an aluminum base) by a heat-conductive conjunction piece 56. Both the metal base 54 and the second cooling fin 42 develop a clearance 302 therebetween such that heat generated by the semiconductor device 20 is conducted to the metal base 54 through the first and second cooling fins 24 and 42 for a better cooling effect.

Figure 6:
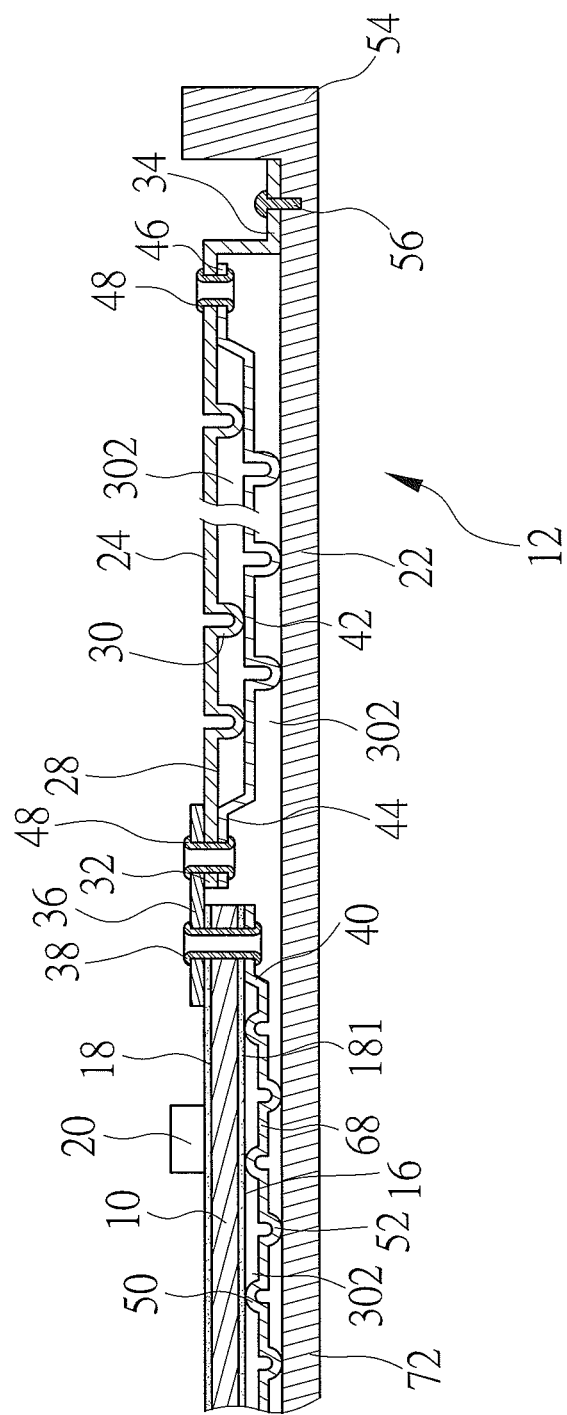
FIGS. 6, 6a, and 6b are schematic views for three patterns of a semiconductor thermal-conductive heat sink structure according to a sixth embodiment of the present invention.
Figure 6A:
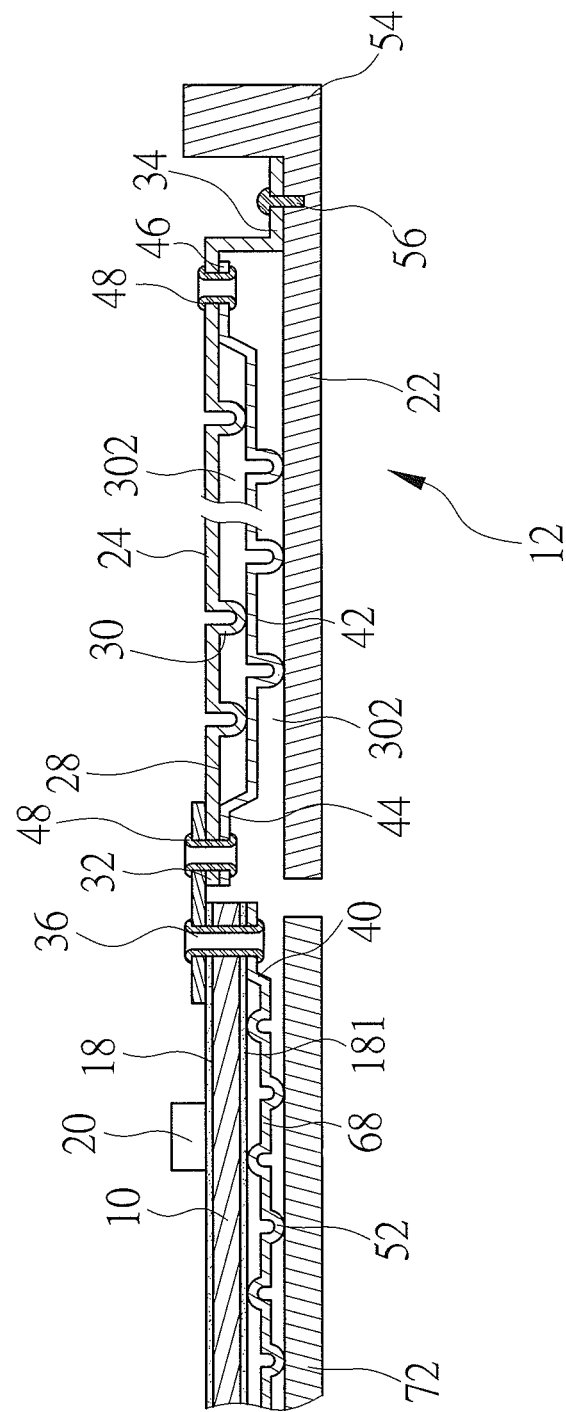
Figure 6B:
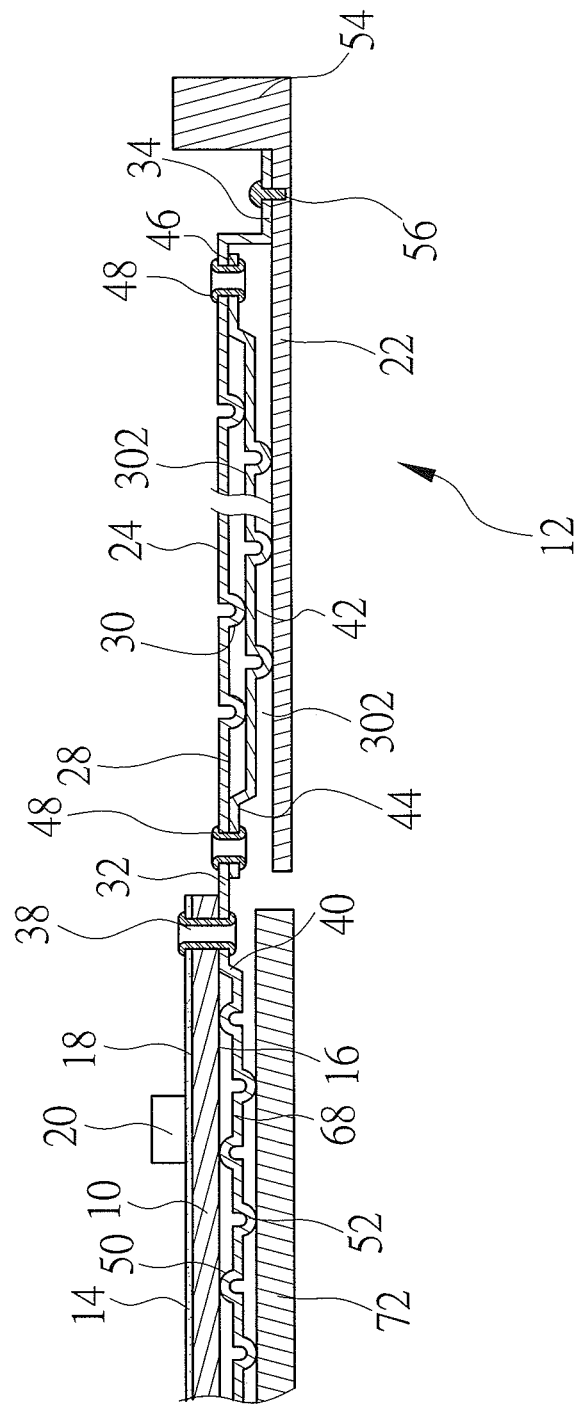

FIGS. 6, 6a and 6b illustrate a semiconductor thermal-conductive heat sink structure in a sixth embodiment of the present invention. In this embodiment, the semiconductor thermal-conductive heat sink structure further includes a substrate cooling fin 68 under the lower plane 16 of the substrate 10. As shown in FIG. 6, the substrate 10 further includes a lower copper foil 181 which joins the substrate cooling fin 68 by the rivets 38 but is separated from the substrate cooling fin 68 by a clearance 302 in between such that heat generated by the semiconductor device 20 is conducted to the lower copper foil 181 as well as greater top and bottom surfaces of the substrate cooling fin 68 for a better cooling effect. Moreover, a plurality of convex portions 50, 52 are respectively designed on top and bottom surfaces of the substrate cooling fin 68 with the convex portions 50 and 52 staggered in arrangement and abutting the lower copper foil 181 and a substrate holder 72, respectively. The substrate holder 72, the thermal-conductive heat sink device socket 22, and the metal base 54 in FIG. 6 are integrally formed. Each of the substrate holder 72 and the socket 22 in FIG. 6a is an independent object, with the socket 22 and the metal base 54 integrally formed. As shown in FIG. 6b, the substrate cooling fin 68 and the first cooling fin 24 are integrally formed, and the first cooling fin 24 is fixed on the lower plane 16 of the substrate 10 by the rivets 38.

Figure 7:
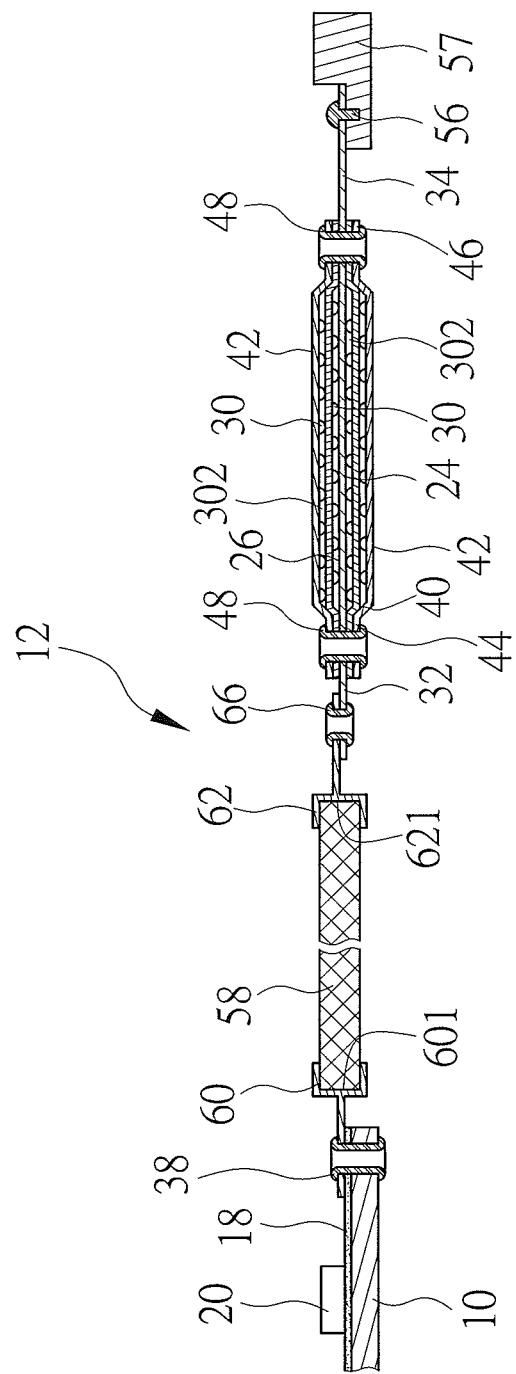
FIGS. 7 and 7a are schematic views for two patterns of a semiconductor thermal-conductive heat sink structure according to a seventh embodiment of the present invention.
Figure 7A:
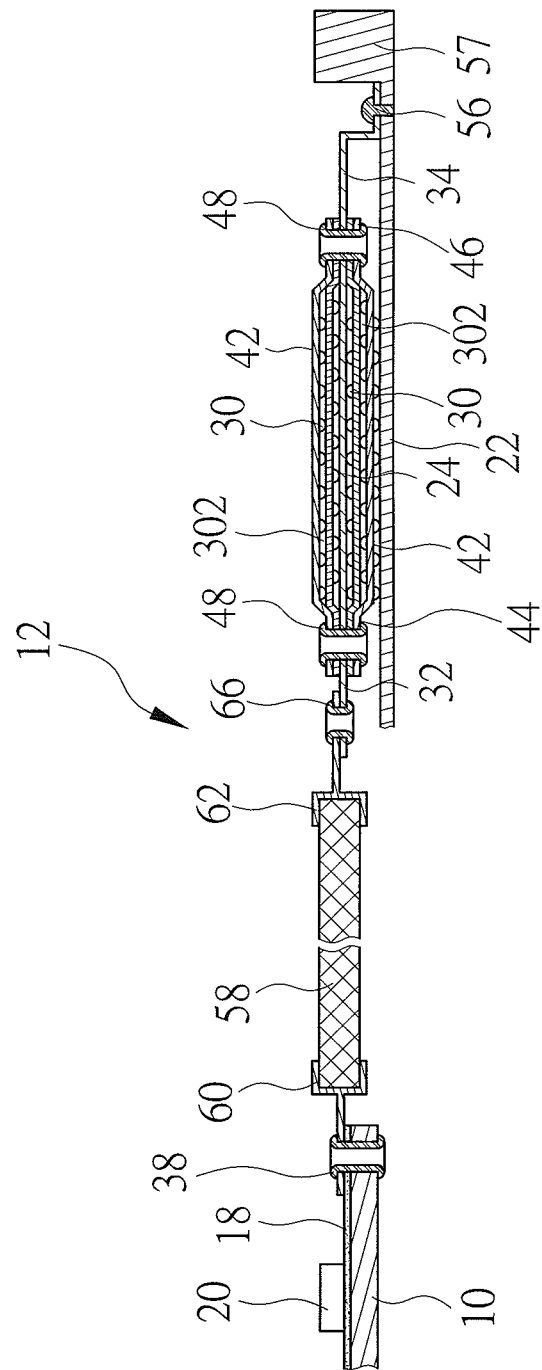
Figure 8:
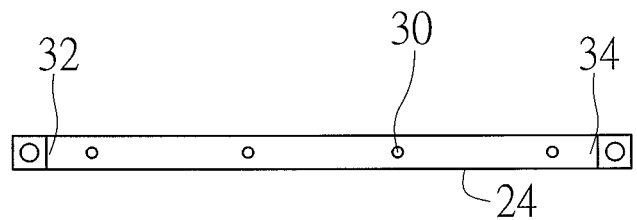
FIGS. 8 through 13 are schematic views for various shapes of a cooling fin in the semiconductor thermal-conductive heat sink structure of the present invention.
Figure 9:
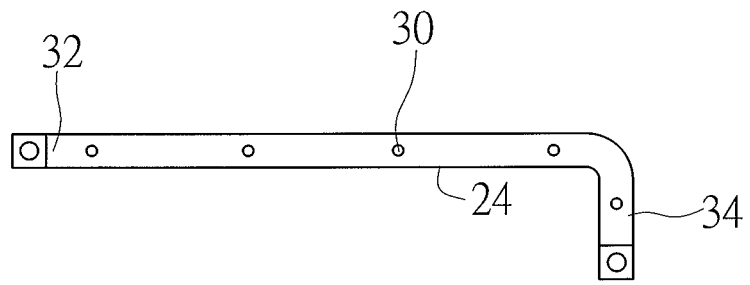
Figure 10:
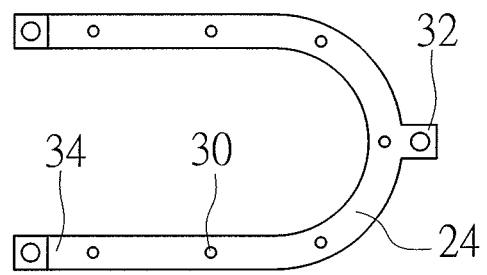
Figure 11:
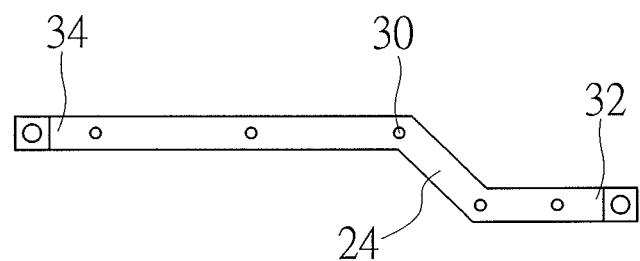
Figure 12:
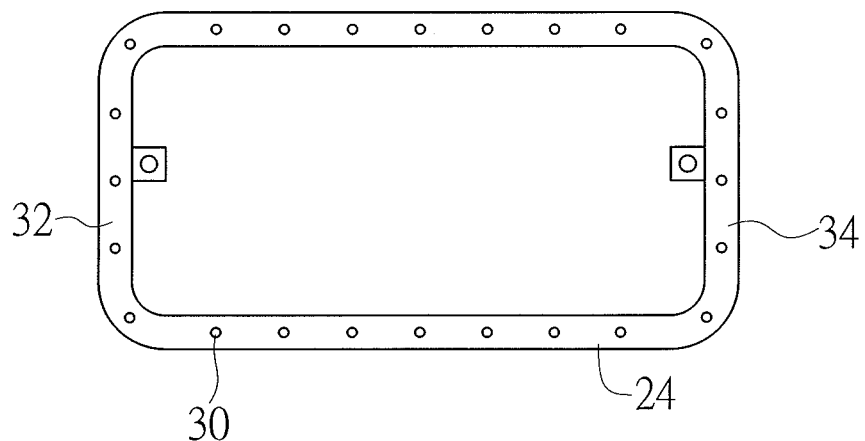
Figure 13:
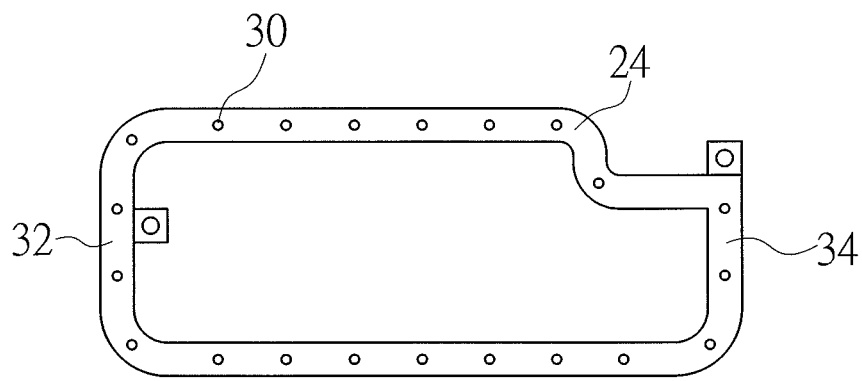

FIGS. 7 and 7a illustrate a semiconductor thermal-conductive heat sink structure in a seventh embodiment of the present invention. In this embodiment, the thermal-conductive heat sink device 12 includes a first cooling fin 24 and a plurality of second cooling fins 42. The first and second ends 44 and 46 of each second cooling fin 42 respectively join the first and second ends 32 and 34 of the first cooling fin 24 by two rivets 48. Two adjacent cooling fins (the first cooling fin 24 and a second cooling fin 42 adjacent the first cooling fin 24, or two adjacent second cooling fins 42) develop a clearance 302 in between due to the existence of the convex portions 30. It should be mentioned that the convex portions 30 of the first cooling fin 24 can protrude outward from the first surface 26 of the first cooling fin 24 for development of the clearance 302. Moreover, the thermal-conductive heat sink device 12 can be held in packing space inside a cooling structure of a mobile phone or a tablet product for a better cooling effect by extending the total cooling areas of more cooling fins between which a micro-clearance is supported by smaller convex portions 30. In this embodiment, with the second end 34 of the first cooling fin 24 connected to an external heat sink body 57, heat generated by the semiconductor device 20 is conducted to the external heat sink body 57 through the first and second cooling fins 24 and 42. Furthermore, the thermal-conductive heat sink device 12 further includes a thermal conductive body 58 made from high-conductive material (for example, graphite or carbon fiber). First and second thermal-conductive parts 60 and 62, both of which are made of metal, are coupled to two end planes of the thermal-conductive body 58, respectively. The first thermal-conductive part 60 joins the top conductive copper foil 18 at the substrate 10 by the thermal-conductive rivet 38, and the second thermal-conductive part 62 joins the first end 32 of the first cooling fin 24 by a rivet 66. As such, heat generated by the semiconductor device 20 is quickly conducted through both the first thermal-conductive part 60 and the thermal-conductive body 58 and arrives at the external heat sink body 57 via the second thermal-conductive part 62 and the first and second cooling fins 24 and 42 for better cooling effect due to extended cooling areas. In addition, for better conductivity effect, the first and second thermal-conductive parts 60 and 62 are covered with diamond coating, characteristic of high thermal conductivity, at surfaces 601 and 621 of the first and second thermal-conductive parts 60 and 62 to which the thermal-conductive body 58 are connected. The count of second cooling fins 42 depends on the size of a heat source and matches the length of the thermal-conductive body 58. As shown in FIG. 7a, the second cooling fin 42 adjacent to the socket 22 includes a plurality of convex portions 30 separated from one another and abutting the socket 22 for development of the clearance 302.

FIG. 8 to FIG. 13 illustrate various shapes of the first cooling fin 24 (or the second cooling fin 42), which include, without limitation, long strip, hook, horseshoe, curve and frame, such that the thermal-conductive heat sink device 12 is available to original layouts of different types of electronic products. Specifically, without any change in the layout of an electronic product, better thermal-conduction and cooling effects are available to semiconductor devices inside an electronic product with an original heat sink component inside the electronic product removed and the thermal-conductive heat sink device 12 installed in a space in which the original heat sink component is held.

The semiconductor thermal-conductive heat sink structure of the present invention depends on the first and second surfaces 26 and 28 of the first cooling fin 24, which are exposed to ambient air, to speed up heat conduction and extend cooling areas. Specifically, heat generated by the semiconductor device 20 is conducted to the first and second cooling fins 24 and 42 for extended cooling areas through the top conductive copper foil 18 and the thermal-conductive rivet 38. Furthermore, the extended cooling areas are available to the first cooling fin 24 and/or the second cooling fin 42, both of which contribute to dissipation of heat generated by the semiconductor device 20, because of a clearance attributed to the convex portions 30 between the first cooling fin 24 and the socket 22 or between two adjacent cooling fins. In addition, the substrate cooling fin 68 as a cooling component under the substrate 10 with a single-sided or double-sided copper foil is hung on the lower plane 16 of the substrate 10 by the thermal-conductive rivet 38 for a better cooling effect.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims, are intended to be embraced therein.

The invention claimed is:

1. A semiconductor thermal-conductive heat sink structure comprising:
   a thermal-conductive heat sink device adapted to be connected to a substrate, with the substrate including an upper plane and a lower plane opposed to the upper plane, with the upper plane provided with a top conductive copper foil on which a semiconductor device is mounted;

wherein the thermal-conductive heat sink device includes a first cooling fin and a thermal-conductive rivet, with the first cooling fin including first and second surfaces opposed in a thickness direction, with the thermal-conductive rivet thermally joining the first cooling fin and the top conductive copper foil for development of cooling planes at the first and second surfaces of the first cooling fin, and wherein the thermal-conductive heat sink device is mounted on a socket for the thermal-conductive heat sink device, with a plurality of convex portions provided between the first cooling fin and the socket, with the first cooling fin and the socket separated from each other by a clearance defined by the plurality of convex portions.

2. The semiconductor thermal-conductive heat sink structure according to claim 1, wherein the plurality of convex portions protrudes toward the first cooling fin from the socket or toward the socket from the first cooling fin.

3. The semiconductor thermal-conductive heat sink structure according to claim 1, wherein the thermal-conductive heat sink device further includes a thermal bridge, with the first end of the first cooling fin combined with the top conductive copper foil through the thermal bridge for heat conduction.

4. The semiconductor thermal-conductive heat sink structure according to claim 1 wherein the semiconductor thermal-conductive heat sink structure further includes a substrate cooling fin under the lower plane of the substrate, with the substrate cooling fin engaged on the lower plane of the substrate by the thermal-conductive rivet and separated from the substrate by a clearance.

5. The semiconductor thermal-conductive heat sink structure according to claim 4, wherein the substrate cooling fin and the first cooling fin are formed integrally.

6. The semiconductor thermal-conductive heat sink structure according to claim 5, wherein the substrate cooling fin includes a top surface and a bottom surface opposed to the top surface, with a plurality of convex portions designed on the top surface and/or the bottom surface of the substrate cooling fin.

7. A semiconductor thermal-conductive heat sink structure comprising:
a thermal-conductive heat sink device adapted to be connected to a substrate, with the substrate including an upper plane and a lower plane opposed to the upper plane, with the upper plane provided with a top conductive copper foil on which a semiconductor device is mounted,
wherein the thermal-conductive heat sink device includes a first cooling fin and a thermal-conductive rivet, with the first cooling fin including first and second surfaces opposed in a thickness direction, with the thermal-conductive rivet thermally joining the first cooling fin and the top conductive copper foil for development of cooling planes at the first and second surfaces of the first cooling fin, and
wherein the thermal-conductive heat sink device further includes at least one second cooling fin separated from the first cooling fin in the thickness direction, with the first cooling fin including spaced first and second ends, with the first end of the first cooling fin thermally connected to the top conductive copper foil by the thermal-conductive rivet, with the second cooling fin including first and second ends which join the first and second ends of the first cooling fin by two rivets, respectively.

8. The semiconductor thermal-conductive heat sink structure according to claim 7, wherein each of the first and second cooling fins is provided with a plurality of convex portions, with the plurality of convex portions of the first and second cooling fins protruding toward the same direction and staggered in arrangement, with the plurality of convex portions of the first cooling fin abutting the second cooling fin.

9. The semiconductor thermal-conductive heat sink structure according to claim 7, wherein each of the first and second cooling fins is provided with a plurality of convex portions, with the convex portions of the first and second cooling fins protruding toward the same direction and staggered in arrangement, with the plurality of convex portions of the first cooling fin abutting the second cooling fin, with the plurality of convex portions of the second cooling fin abutting the socket for the thermal-conductive heat sink device.

10. The semiconductor thermal-conductive heat sink structure according to claim 7, wherein the thermal-conductive heat sink device further includes a thermal-conductive body, wherein first and second thermal-conductive parts made of metal are respectively coupled to two end planes of the thermal-conductive body, with the first thermal-conductive part joining the top conductive copper foil at the substrate by the thermal-conductive rivet, with the second thermal-conductive part joining the first end of the first cooling fin by a rivet.

11. The semiconductor thermal-conductive heat sink structure according to claim 7, wherein either the first cooling fin or the second cooling fin includes at least one bending portion which extends at oblique or right angle.

12. The semiconductor thermal-conductive heat sink structure according to claim 7, wherein the at least one second cooling fin includes a plurality of second cooling fins, with a clearance provided between two adjacent second cooling fins.

13. The semiconductor thermal-conductive heat sink structure according to claim 12, wherein a plurality of spaced convex portions provided in the clearance and between two adjacent second cooling fins.

14. A semiconductor thermal-conductive heat sink structure comprising:
a substrate including an upper plane and a lower plane opposed to the upper plane, with the upper plane provided with a top conductive copper foil on which a semiconductor device is mounted; and
a thermal-conductive heat sink device connected to the substrate and including a first cooling fin and a thermal-conductive rivet, with the first cooling fin including first and second surfaces opposed in a thickness direction, with the thermal-conductive rivet thermally joining the first cooling fin and the top conductive copper foil for development of cooling planes at the first and second surfaces of the first cooling fin,
wherein the thermal-conductive heat sink device is mounted on a socket for the thermal-conductive heat sink device, with a plurality of convex portions provided between the first cooling fin and the socket, with the first cooling fin and the socket separated from each other by a clearance defined by the convex portions, with the convex portions protruding toward the first cooling fin from the socket or toward the socket from the first cooling fin.

15. The semiconductor thermal-conductive heat sink structure according to claim 14, wherein the thermal-conductive heat sink device further includes at least one second cooling fin separated from the first cooling fin in the thickness direction, with the first cooling fin including spaced first and second ends, with the first end of the first cooling fin thermally connected to the top conductive copper foil by the thermal-conductive rivet, with the second cooling fin including first and second ends which join the first and second ends of the first cooling fin by two rivets, respectively.

16. The semiconductor thermal-conductive heat sink structure according to claim 14, wherein each of the first and second cooling fins is provided with a plurality of convex portions, with the plurality of convex portions of the first and second cooling fins protruding toward the same direction and staggered in arrangement, with the plurality of convex portions of the first cooling fin abutting the second cooling fin.

* * * * *